(12) United States Patent
Daigle et al.

(10) Patent No.: US 10,573,711 B2
(45) Date of Patent: Feb. 25, 2020

(54) SEMICONDUCTOR DEVICE RESISTOR INCLUDING VIAS AND MULTIPLE METAL LAYERS

(71) Applicant: SEMICONDUCTOR COMPONENTS INDUSTRIES, LLC, Phoenix, AZ (US)

(72) Inventors: Tyler Daigle, Scarborough, ME (US); Andrew Jordan, Scarborough, ME (US); Hrvoje Jasa, Scarborough, ME (US); Gregory Maher, Cape Elizabeth, ME (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 30 days.

(21) Appl. No.: 15/649,533

(22) Filed: Jul. 13, 2017

(65) Prior Publication Data
US 2019/0019859 A1  Jan. 17, 2019

(51) Int. Cl.
*H01L 23/52* (2006.01)
*H01L 49/02* (2006.01)
*H01L 23/528* (2006.01)
*H01L 23/522* (2006.01)
*G01R 15/14* (2006.01)
*H01L 23/532* (2006.01)

(52) U.S. Cl.
CPC ............ *H01L 28/24* (2013.01); *G01R 15/146* (2013.01); *H01L 23/5228* (2013.01); *H01L 23/5283* (2013.01); *H01L 23/5226* (2013.01); *H01L 23/53214* (2013.01); *H01L 23/53257* (2013.01)

(58) Field of Classification Search
CPC ...... H01L 28/24; H01L 28/20; H01L 27/0802; H01L 27/1112; H01L 23/52; H01L 23/5228; H01L 23/5283
See application file for complete search history.

(56) References Cited

U.S. PATENT DOCUMENTS

| 6,291,305 | B1 * | 9/2001 | Huang | H01L 21/64 257/E21.022 |
|---|---|---|---|---|
| 6,559,544 | B1 * | 5/2003 | Roth | H01L 21/76892 257/750 |
| 6,614,049 | B1 * | 9/2003 | Koyama | H01L 22/34 257/48 |
| 10,024,891 | B2 * | 7/2018 | Draxelmayr | G01R 1/20 |
| 2005/0168319 | A1 * | 8/2005 | Bhattacharya | H01C 1/14 338/309 |
| 2008/0206908 | A1 * | 8/2008 | Walter | G01R 31/2831 438/18 |
| 2008/0303539 | A1 * | 12/2008 | Chen | G01R 31/2884 324/755.11 |

(Continued)

*Primary Examiner* — Fazli Erdem
(74) *Attorney, Agent, or Firm* — Brake Hughes Bellermann LLP

(57) ABSTRACT

In one general aspect, an apparatus can include a first terminal, a second terminal, and a resistive element extending between the first terminal and the second terminal. The resistive element can include a first via in contact with a first segment of a first metal layer and a first segment of a second metal layer, and can include a second via in contact with the first segment of the second metal layer and a second segment of the first metal layer. The apparatus can also include a third via in contact with the second segment of the first metal layer and a third segment of the second metal layer.

21 Claims, 10 Drawing Sheets

(56) References Cited

U.S. PATENT DOCUMENTS

| | | | |
|---|---|---|---|
| 2010/0072574 A1* | 3/2010 | Ohshima | H01C 1/16 257/536 |
| 2011/0012677 A1* | 1/2011 | Dooper | H03F 3/2173 330/251 |
| 2011/0095818 A1 | 4/2011 | Sullivan | |
| 2012/0112873 A1* | 5/2012 | Le Neel | H01C 17/0656 338/25 |
| 2013/0223649 A1 | 8/2013 | Srivastava et al. | |
| 2015/0303246 A1* | 10/2015 | Shi | H01L 29/0649 257/506 |
| 2016/0322455 A1* | 11/2016 | Woodford | H01L 28/24 |
| 2017/0323835 A1* | 11/2017 | Ogawa | H01L 22/34 |

* cited by examiner

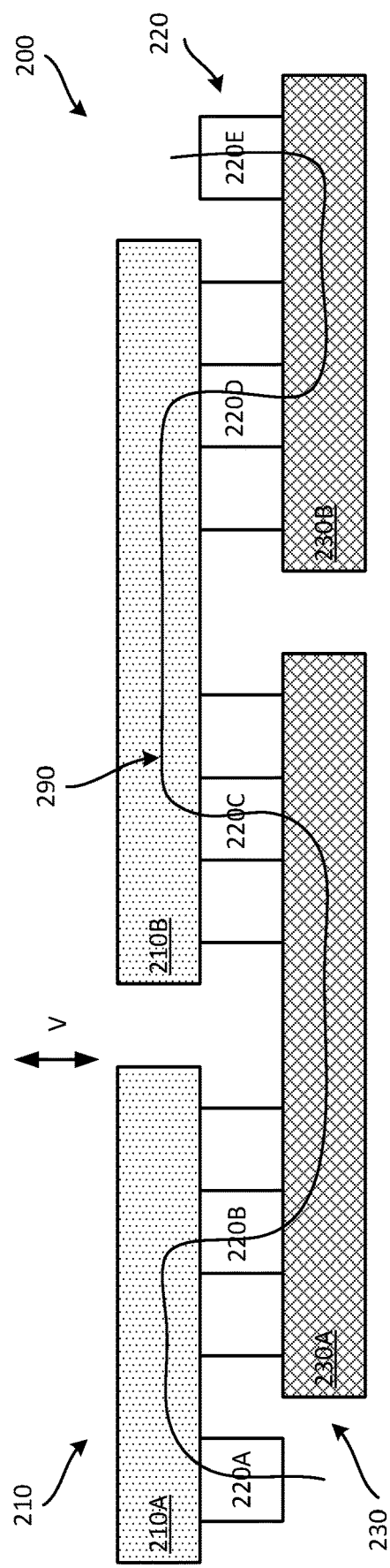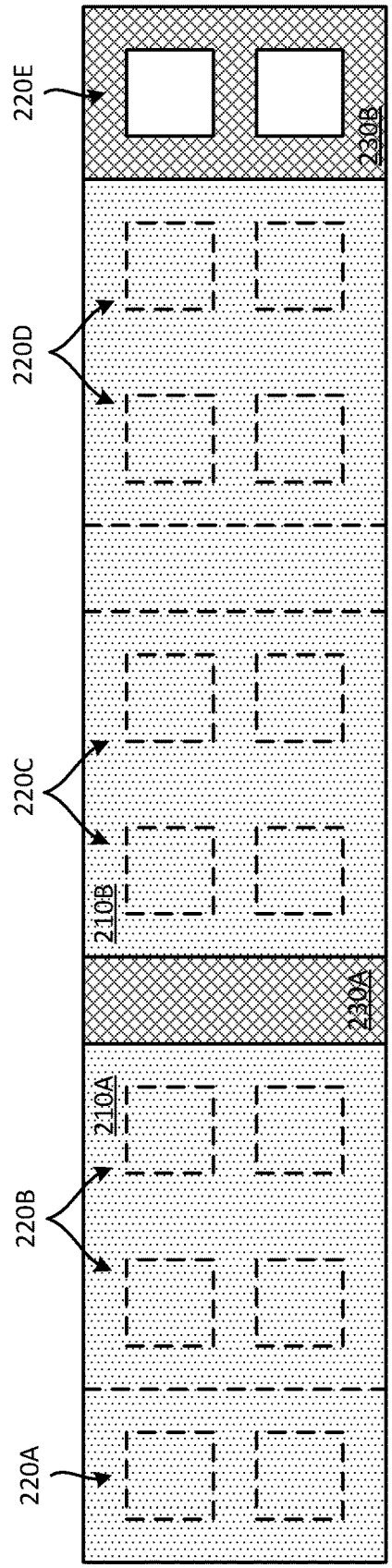
FIG. 2A
FIG. 2B

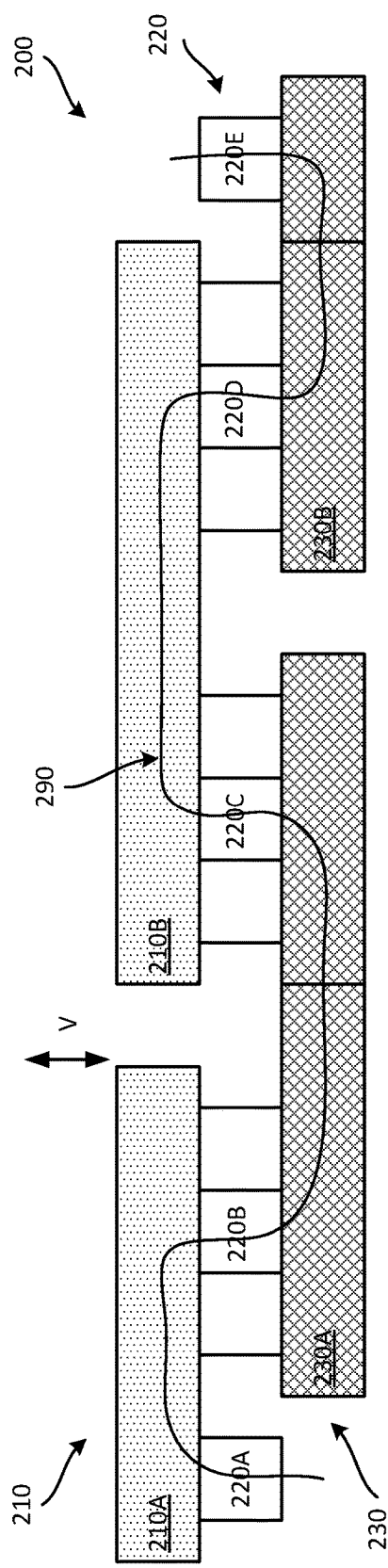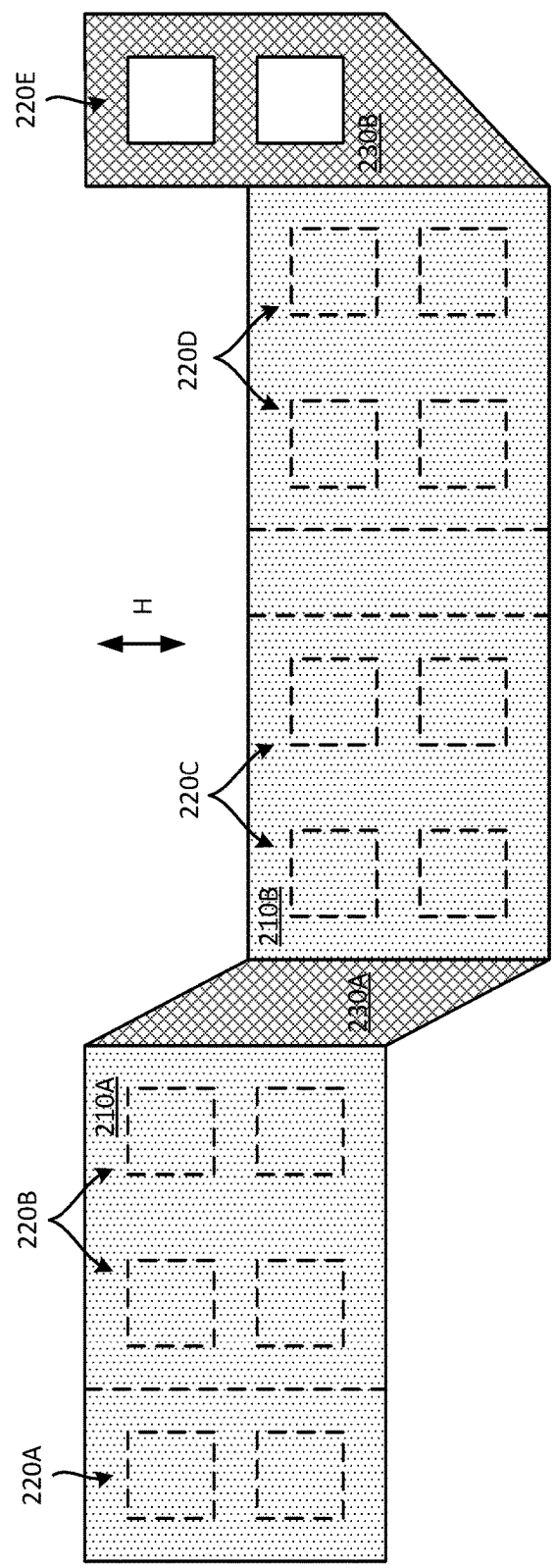

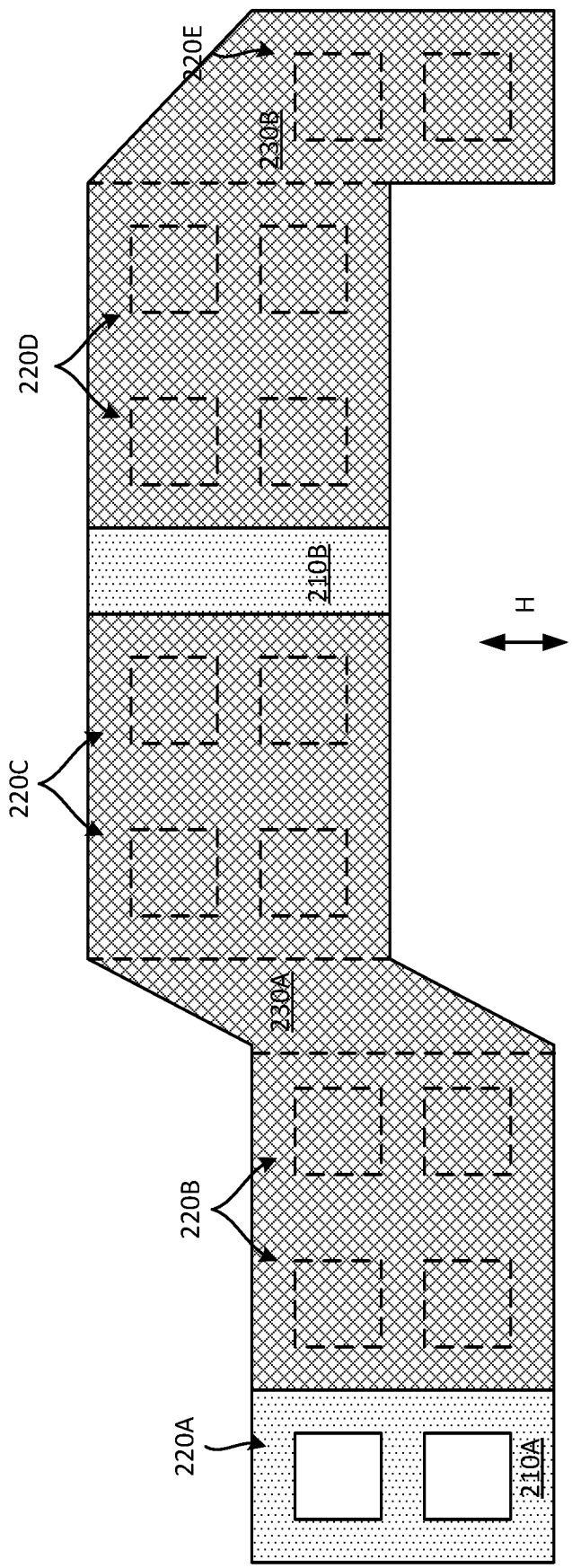

SEMICONDUCTOR DEVICE RESISTOR INCLUDING VIAS AND MULTIPLE METAL LAYERS

TECHNICAL FIELD

This description relates to a semiconductor device resistor including vias and multiple metal layers.

BACKGROUND

Known devices (e.g., load driver devices) can include, for example, a current sense resistor. These current sense resistors, however, can be susceptible to variations in response to temperature that can result in distorted measurements. A digital and/or analog circuit may be included in devices to correct for the measurement distortion. Such a digital and/or analog circuit may not be desirable in many implementations.

SUMMARY

In one general aspect, an apparatus can include a first terminal, a second terminal, and a resistive element extending between the first terminal and the second terminal. The resistive element can include a first via in contact with a first segment of a first metal layer and a first segment of a second metal layer, and can include a second via in contact with the first segment of the second metal layer and a second segment of the first metal layer. The apparatus can also include a third via in contact with the second segment of the first metal layer and a third segment of the second metal layer.

BRIEF DESCRIPTION OF THE DRAWINGS

FIGS. 2A and 2B are diagrams that illustrate an example resistive element that is a variation of the resistive element shown in FIGS. 1A through 1C.

FIGS. 2C through 2E illustrate a variation of the resistive element shown in FIGS. 2A and 2B.

DETAILED DESCRIPTION

A resistive element can be defined using primarily vias with metal layers connecting the vias because the vias have robust characteristics (e.g., relatively stable or constant resistivity) with temperature changes (e.g., temperature changes due to self-heating) and/or voltage changes (e.g., large voltage signal changes). Specifically, the resistive element can be defined using primarily vias, and some portions of connecting metal layers, because the vias can have low voltage (e.g., voltage coefficient of resistance, VC (ppm/V)), and/or temperature coefficients (e.g., temperature coefficient of resistance, TC (1/K)), to reduce (e.g., minimize) that make the resistive element robust against, for example, signal distortion in response to temperature and/or voltage changes. Accordingly, the resistive element can be used in applications where variations of characteristics of the resistive element in response to temperature and/or voltage would be undesirable. As a specific example, the resistive elements described herein can be used as a current sense resistor where predictable measurements are desirable without the used of a digital and/or analog circuit to correct for measurement distortion.

Figure 1B:
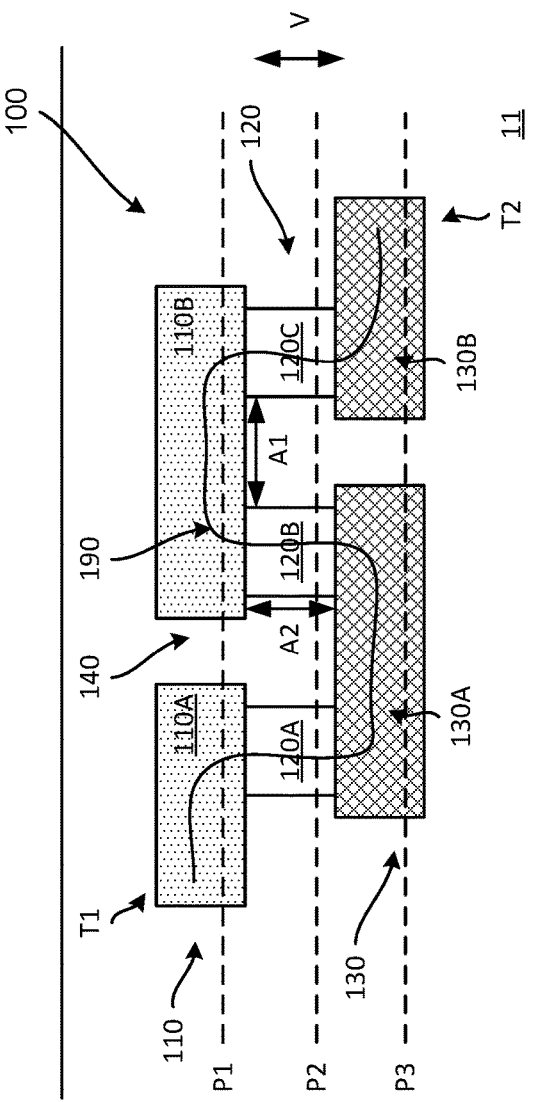
FIGS. 1B and 1C are diagrams that illustrate more detailed views of the resistive element shown in FIG. 1A.
Figure 1A:
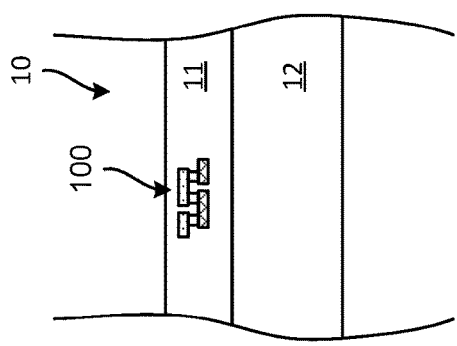
FIG. 1A is a diagram that illustrates a side cross-sectional view of a resistive element included in a semiconductor device.

FIG. 1A is a diagram that illustrates a side cross-sectional view of a resistive element 100 included in a semiconductor device 10 (e.g., a semiconductor die). As shown in FIG. 1A, the resistive element 100 can be included a metal layer portion 11 of the semiconductor device 10. The metal layer portion 11 of the semiconductor device 10 can be disposed on a semiconductor substrate 12. The semiconductor substrate 12 can include one or more semiconductor devices (e.g., transistors, metal oxide semiconductor field effect transistors (MOSFETs), bipolar junction transistors (BJTs), trench MOSFETs, diodes, integrated circuits, etc.). In some implementations, the semiconductor substrate 12 can include one or more epitaxial layers, doped regions of various conductivity types (e.g., P-type, N-type), and/or so forth.

The metal layer portion 11 can include multiple metal layers, vias, and/or so forth that can function as conductive routing (e.g., signal routing) within the semiconductor device 10. A dielectric (e.g., dielectric portions) can be included in the metal layer portion 11 as an insulator between, for example, elements of the conductive routing of the metal layer portion 11.

The resistive element 100 shown in FIG. 1A can be defined using two or more of the multiple metal layers and the vias included in the metal layer portion 11. In other words, the resistive element 100 can be defined using the conductive routing within the metal layer portion 11. The resistive element 100 can be defined using the conductive routing materials, such as vias, which have robust characteristics (e.g., relatively stable or constant resistivity) with temperature changes (e.g., temperature changes due to self-heating) and/or voltage changes (e.g., large voltage signal changes). As a specific example, the resistive element 100 can be defined using largely tungsten in vias (with relatively little aluminum from the metal layers connecting the vias) so that the resistive element 100 has desirable temperature characteristics. Accordingly, the resistive element 100 can be a tungsten-based resistor.

Because the resistive element 100 is defined using the conductive routing (e.g., vias), the resistive element 100 can function as a resistor element that has robust characteristics with temperature changes and/or voltage changes. The resistive element 100 is defined using the conductive routing (e.g., vias and some portions of metal layers), which can have low voltage (e.g., voltage coefficient of resistance, VC (ppm/V)), and/or temperature coefficients (e.g., temperature coefficient of resistance, TC (1/K)), to reduce (e.g., minimize), for example, undesirable resistive element characteristics or responsiveness (e.g., signal distortion). The resistive element 100 can be an on-chip sensing element used to provide, for example, a high-quality load current measurement, without digital and/or analog backend correction for variations due to temperature and/or voltage, all while minimizing die area. Specifically, the resistive element 100 can be defined using primarily vias with metal layers connecting the vias (within the metal layer portion 11) because the vias have more constant (e.g., flatter) characteristics in response to changes in temperature and/or voltage. Accordingly, the resistive element 100 can be advantageous over, for example, salicided polysilicon and/or aluminum-based resistors which can have relatively large voltage and/or temperature coefficients. Use of the salicided polysilicon and/or aluminum-based resistors, in some applications, can result in, for example, measurement distortion, changes in circuit behavior, and/or so forth in response to changes in voltage and/or temperature. In contrast, the resistive element 100 described herein can have stable (e.g., predictable) behavior, in circuit applications, even with changes in voltage and/or temperature, thus obviating the need for digital and/or analog circuits to correct for resistive element behavior.

Figure 1C:
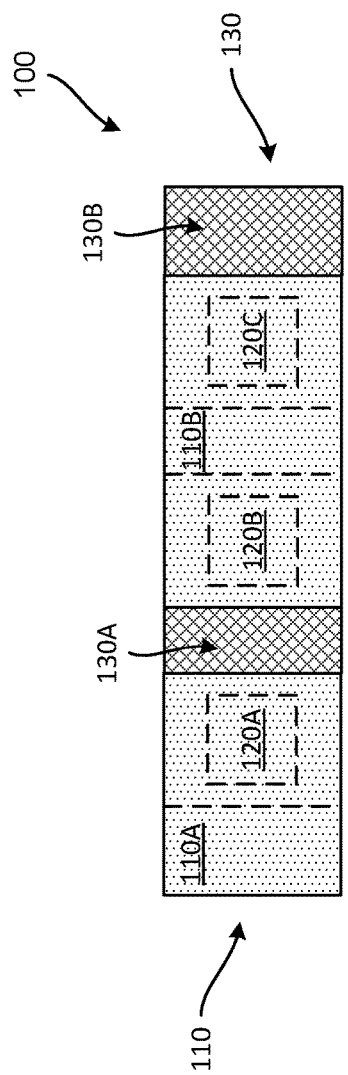

A more detailed cross-sectional view of the resistive element 100 is shown in FIG. 1B, and a more detailed top (or plan) view of the resistive element 100 is shown in FIG. 1C. As shown in FIG. 1B, the resistive element 100 includes a metal layer 110 (including segments 110A and 110B) and a metal layer 130 (including segments 130A and 130B). The resistive element 100 includes vias 120 (including vias 120A through 120C). The segments of the metal layers 110, 130 can be referred to as metal segments (e.g., metal segment 110A). Each of the vias 120 (e.g., a top surface, a bottom surface) in this example resistive element 100 is in contact with (e.g., coupled (e.g., disposed) to, conductively coupled to, directly coupled to) at least one of the segments of the metal layers 110, 130.

The resistive element 100 provides a resistive path 190 that is defined by the segments of the metal layer 110, the vias 120, and the segments of metal layer 130. The segments of the metal layer 110, the vias 120, and the segments of metal layer 130 define a serpentine structure (e.g., a serpentine cross-sectional shape, a serpentine pattern, a vertical serpentine). In other words, the resistive path 190 defines a serpentine pattern as shown in FIG. 1B that serpentines in a vertical direction V (orthogonal to a plane along which the semiconductor die 10 is aligned). Specifically, the resistive path 190 is defined (in order or in reverse order) by metal segment 110A, via 120A, metal segment 130A, via 120B, metal segment 110B, via 120C, metal segment 130B. As shown in FIG. 1B, the resistive path alternates between the segments of the metal layer 110 (e.g., first metal layer) and the segments of the metal layer 120 (e.g., second metal layer) through the vias 120 to define the cross-sectional serpentine structure. Said differently, the vias 120 are coupled between (e.g., conductively coupled between) segments of the metal layer 110 alternating with segments of the metal layer 130.

In this example resistive element 100, the resistive path 190 can be defined between metal segment 110A and metal segment 130B. The metal segments 110A, 130B can function as terminals (e.g., terminals T1, T2, respectively) of the resistive element 100. Accordingly, the resistive path 190 can be defined between terminals, which in this example implementation, are metal segments 110A, 130B. In some implementations, a variety of elements or features (some of which are not shown) can function as terminals (also can be referred to as terminal elements) of a resistive element (e.g., resistive element 100). For example, a via, a conductive pad or contact, a metal segment, etc. can function as a terminal element of a resistive element. A resistive path can be defined between terminal elements through metal layers and vias. In some implementations, a resistive path can include one or more terminal elements.

A dielectric 140 (e.g., dielectric portion(s)) can be included between or around the segments of the metal layer 110, the vias 120, and the segments of metal layer 130. As a specific example, a portion of the dielectric 140 can be disposed between metal segments 110A, 110B (e.g., pair of metal segments 110A, 110B). A portion of the dielectric 140 can also be disposed between the vias 120A, 120B.

In some implementations, the majority (e.g., majority of the distance (e.g., linear distance), majority of the volume) of the resistive path 190 can be defined by the vias 120. For example, in some implementations, more than 50% of the distance (or volume) of the resistive path 190 can be defined by the vias 120. In some implementations, more than 80% (e.g., 90%, 96%) of the distance (or volume) of the resistive path 190 can be defined by the vias 120. Because the metal layers 110, 130 can each have a temperature coefficient greater than a temperature coefficient of each of the vias 120, more than half of the resistive element 100 (and/or resistive path 190) can be made of a material that has a temperature coefficient less than a temperature coefficient of the metal layers 110, 130.

Although not necessarily shown in FIG. 1B, in some implementations, a distance A1 (e.g., a horizontal distance) between vias (along a metal segment between vias) (e.g., along metal segment 110B between vias 120B, 120C) can be shorter than a distance A2 (e.g., a vertical distance) along a via (e.g., vias 120B, 120C). In other words, the distance A2 (height of a via) can be greater than the distance A1 (distance between vias or along a metal segment between vias). In some implementations, the distance A2 can be more than two times greater than the distance A1.

Because a relatively large portion of the resistive path 190 can be defined by the vias 120, the material of the vias 120 can primarily define the characteristics of the resistive element 100. In some implementations, the vias 120 can be made of a conductive material (e.g., conductive routing material) such as tungsten, which can have properties for a resistor with desirable temperature characteristics (e.g., relatively low changes in properties in response to temperature).

A resistance of the resistive element 100 along the resistive path 190 can be defined, in some implementations, by a distance along the resistive path 190. Specifically, the resistance of the resistive path 190 can be defined by combination (e.g., summation) of the linear distance through the metal segments 110, 130 (e.g., distance A1 through metal segment 110B) and the linear distance through the vias 120 (e.g., distance A2 through via 120B). For example, by increasing the height (and linear distance) through the vias 120, the resistance of the resistive element 100 along the resistive path 190 can be increased. When the height of the vias 120 (e.g., distance A2) is greater than the distance through the metal layers 110, 130 (e.g., distance A1), the overall behavior of the resistive element 100 can be more like the vias 120 (with temperature and voltage coefficients of the vias 120) than the metal layers 110, 130.

In the diagrams illustrated in FIGS. 1A through 1C, the vias 120 of the resistive element 100 are represented by single vias. However, in some implementations one or more of the vias 120 can be, or can include, an array of vias (e.g., two or more vias, at least 4 vias, etc.) (also can be referred to as a via array). In some implementations, a via array can be included in the resistive element 100 so that the current carrying capacity (e.g., current density capability) of the resistive element 100 can be at a desirable level (e.g., can be increased beyond on a single via). In some implementations, the current carrying capacity of the resistive element 100 along the resistive path 190 can be defined by the cross-sectional area (e.g., width, height) of the metal layers 110, 130, and the cross-sectional area (e.g., number) of vias 120 along each vertical connection between segments of the metal layer 110, 130. For example, by increasing the number of vias 120 (at each vertical junction between segments of metal layers 110, 120) and/or increasing the width of the metal layers 110, 120 (along each metal segment), the current carrying capacity of the resistive element 100 along the resistive path 190 can be increased.

In some implementations, an individual via can have a current capacity of greater than 0.2 mA/via (e.g., 0.3 mA/via, 0.5 mA/via). In some implementations, an individual via or via array can have a resistance value of between 0.1 mΩ to 10 mΩ (e.g., 1.8 mΩ, 2.2 mΩ).

In some implementations, the number of vias in an array of vias within a resistive path of the resistive element (e.g., resistive path 190 of the resistive element 100) can be defined based on target current handling capacity and/or expected load (e.g., maximum expected load). In some implementations, the number of vias in series along a resistive path of the resistive element (e.g., resistive path 190 of the resistive element 100) can be configured based on a target total resistance of a resistive element. An example of a resistive element that includes an array of vias is illustrated in at least, for example, FIGS. 2A, 2B, 5A, and 5B.

In some implementations, a number of vias included in a resistive element can be greater than (e.g., significantly greater than, two times greater than, five times greater than, more than 10 times greater than) a number of metal segments included in the resistive element. For example, if the vias 120 each is, or includes, an array of vias, the total number of vias 120 can be greater than the total number of segments included in metal layers 110, 130. Accordingly, the resistive element 100 can be a physical implementation of, for example, a vertical resistor (e.g., a vertical current sense resistor) that reduces die area and number of metal layers (because of the number of vias relative to metal layer area) while providing improved current handling capability.

In some implementations, the resistive element 100 can be defined so that the resistive element is beneficial compared to, for example, aluminum and/or salicided polysilicon on-chip resistors due to the lower temperature coefficient, higher current handling capability in equivalent area (from a plan view perspective), and/or higher resistance in equivalent area (from a plan view perspective) of the resistive element 100. In some implementations, the architecture of the resistive element 100 can reduce die area to less than half of an area when using metal only. The resistive element 100, in some implementations, can improve current density capability so that self-heating affects are diluted and/or the lifetime of the semiconductor device 10 can be increased As shown in FIG. 1B, the segments of the metal layer 110 are aligned along (or intersect) a plane P1, and the segments of the metal layer 130 are aligned along (or intersect) a plane P3. Accordingly, the metal layer 110 is disposed within a plane parallel to the metal layer 130. Each of the vias 120 are also aligned along (or intersect) a plane P2. In addition, portions of dielectric between segments of the metal layers 110, 130 are aligned within the respective planes associated with the metal layers 110, 130.

As described above, one or more of the vias 120 can be made of a material such as tungsten, which has a temperature coefficient less than (e.g., one-third) that of, for example, aluminum or another metal. In some implementations, one or more of the vias 120 can be made of an conductive alloy (e.g., metal alloy) including tungsten. In some implementations, one or more of the vias 120 can include a conductive material such as aluminum. In some implementations, one or more of the vias 120 can be made of a material that has a temperature coefficient lower than that of a metal such as aluminum. One or more of the metal layers 110, 130 can be made of, or can include, a material such as aluminum, copper, a metal alloy, and so forth.

In some implementations, one or more of terminals of the resistive element 100 can be coupled to one or more semiconductor devices such as a transistor (e.g., an integrated circuit) included in the semiconductor substrate 12. In some implementations, one or more of the terminals of the resistive element can be coupled to one or more contact pads (e.g., contact pad associated with (e.g., coupled to) the metal layer portion 11 that can be used to couple the semiconductor device 10 to an external component (e.g., leadframe) or wire (e.g., a wirebond).

As an example implementation, the resistive element 100 can be included in a semiconductor device (e.g., a battery charger, a haptics motor driver, a load driver, an audio driver) such as a current sense element in which voltage drop across the resistive element 100 is measured and current is calculated. In order to reduce (e.g., minimize) distortion, the resistive element 100, which is defined using conductive routing materials (e.g., mostly vias 120), can have an ultra-low variation over current density (which can cause self-heating of the resistive element 100). Accordingly, the resistive element 100 can have relatively low variation in performance (e.g., characteristics, resistivity) in response to the self-heating caused by the current density.

As mentioned above, the resistive element 110 can be an on-chip sensing element that can provide a high-quality measurement of an output (e.g., an audio output) that has reduced distortion due to voltage coefficients and/or self-heating. When measuring a signal (e.g., a large signal), the semiconductor device 10 can tend to heat-up at, for example, the peaks/troughs of the signal and can cool down at the zero crossings of the signal. Self-heating can be a particular problem at frequencies up to approximately 1 kilo-Hertz (kHz), which is unexpected phenomenon. More details related to this phenomenon are described in connection with at least FIGS. 7A and 7B. As a result, if the semiconductor device 10 included a sensing element with a relatively large temperature coefficient, the sensing element would provide a distorted measurement in response to self-heating. In contrast, the resistive element 100 can be robust against such distortion issues because the resistive element 100 includes (e.g., uses) routing material with low voltage and temperature coefficients to reduce (e.g., minimize) large signal distortion.

In some implementations, the resistive element 100 can have a more ideal (and linear) resistive behavior in response to a load current (which causes increased temperature) without the need for compensation due to typical non-ideal behavior of an on-chip resistor. This can be contrasted with known applications where measuring a load current with a non-linear on chip sense resistor can require compensating for variations over temperature changes.

FIGS. 2A and 2B are diagrams that illustrate an example resistive element 200 that is a variation of the resistive element 100 shown in FIGS. 1A through 1C. FIG. 2A illustrates a side cross-sectional view of the resistive element 200 and FIG. 2B illustrates a plan (or top) view of the resistive element 200. Because the resistive element 200 is a variation of the resistive element 100, not all of the features (which can be included) associated with the resistive element 100 will be described again in connection with the resistive element 200. The resistive element 200 can also include any of the features included any of the resistive elements described herein.

As shown in FIGS. 2A and 2B, the resistive element 200 includes arrays of vias 220 (e.g., via arrays 220A through 220E) along a resistive path 290. The resistive path 290 also includes metal segments 210A, 210B, 230A, and 230B. The via arrays 220B through 220D include four vias each (in two dimensions when viewed in the plan view of FIG. 2B) and the via arrays 220A, 220E include two vias each. In some implementations, more vias than shown in FIGS. 2A, 2B can be included in one or more of the via arrays 220.

In this implementation, the via arrays 220A, 220E can function as terminals of the resistive element 200. The via arrays 220A, 220E can each be included in the resistive path 290.

FIGS. 2C through 2E illustrate a variation of the resistive element 200 shown in FIGS. 2A and 2B. In this implementation, at least a portion (e.g., metal segment 210B) of the resistive element 200 is shifted along a horizontal direction H (out of alignment with metal segments 210A), which is orthogonal to the vertical direction V. FIG. 2D is viewed from above the resistive element 200 shown in FIG. 2C and FIG. 2E is viewed from below the resistive element 200 shown in FIG. 2C. This variation of the resistive element 200 can also include any of the features included any of the resistive elements described herein. The examples shown in FIGS. 2C through 2E can be advantageous in some implementations where routing the resistive element 200 around a feature may be needed. The metal layers 210, 230 can be configured to avoid, for example, current crowding (e.g., by defining diagonally formed metal sections).

Figure 3:
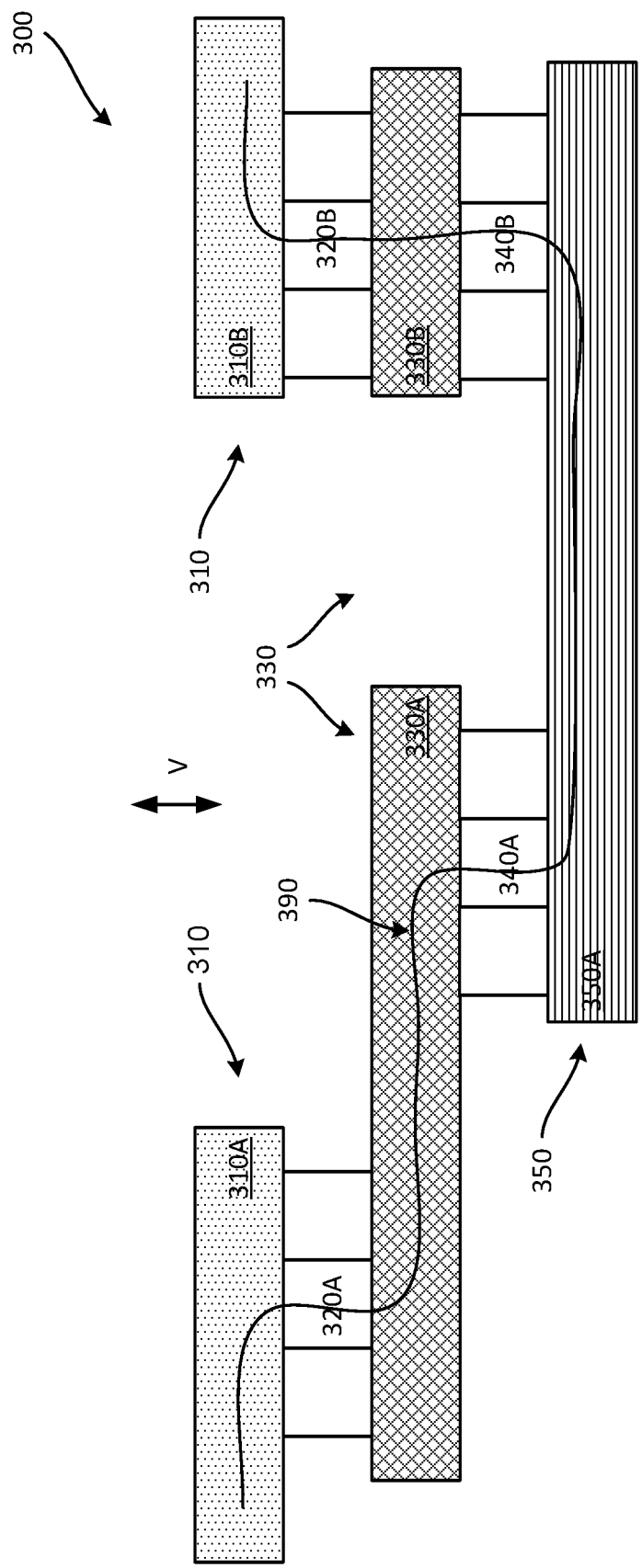
FIG. 3 is a diagram that illustrates an example resistive element that is a variation of the resistive element shown in FIGS. 1A through 1C.

FIG. 3 is a diagram that illustrates an example resistive element 300 that is a variation of the resistive element 100 shown in FIGS. 1A through 1C. FIG. 3 illustrates a side cross-sectional view of the resistive element 300. Because the resistive element 300 is a variation of the resistive element 100, not all of the features (which can be included) associated with the resistive element 100 will be described again in connection with the resistive element 300. The resistive element 300 can also include any of the features included any of the resistive elements described herein.

As shown in FIG. 3, the resistive element 300 includes three metal layers (e.g., three levels of metal layers) including metal layer 310, metal layer 330 and metal layer 350. The resistive element 300 includes two levels of via layers (via layers 320, 340) disposed between the metal layers 310, 330, 350. The resistive path 390 defined by the structure of the resistive element 300 traverses the metal layers 310, 330, 350 and the via layers 320, 340.

As shown in FIG. 3, the via arrays 320B and 340B are vertically stacked (with metal segment 330B disposed therebetween). This can be advantageous because traversing (e.g., lateral traversal) of a metal segment can be reduced (e.g., avoided) and the resistance of the resistive element 300 can be concentrated in a vertical direction along the vertically oriented vias. Accordingly, in some implementations, a resistive element can include two or more stacked (e.g., vertically stacked) vias (e.g., via arrays) with metal segments disposed between pairs of stacked vias (e.g., via arrays). In some implementations, a resistive element can include many (or exclusively) stacked pairs of vias.

In some implementations, a resistive element can include more than three metal layers. In some implementations, a resistive path defined by a resistive element can traverse three or more metal layers in a regular (or repeating) serpentine pattern as shown in, for example, FIGS. 1A through 1C. The resistive path defined by a resistive element can traverse the through more metal layers in a regular pattern in a horizontal and/or vertical direction. In some implementations, a resistive path defined by a resistive element can traverse three or more metal layers in an irregular serpentine pattern (in a serpentine structure). The resistive path defined by a resistive element can traverse the three or more metal layers in an irregular pattern in a horizontal and/or vertical direction.

For example, a resistive path defined by a resistive element can alternate between a first pair metal layers and vias along a first portion, and can traverse three or more metal layers and vias along a second portion. As another example, a resistive path defined by a resistive element can alternate between a first pair metal layers and vias along a first portion, traverse three or more metal layers and vias along a second portion, and alternate between a second pair of metal layers and vias along a third portion.

Figure 4:
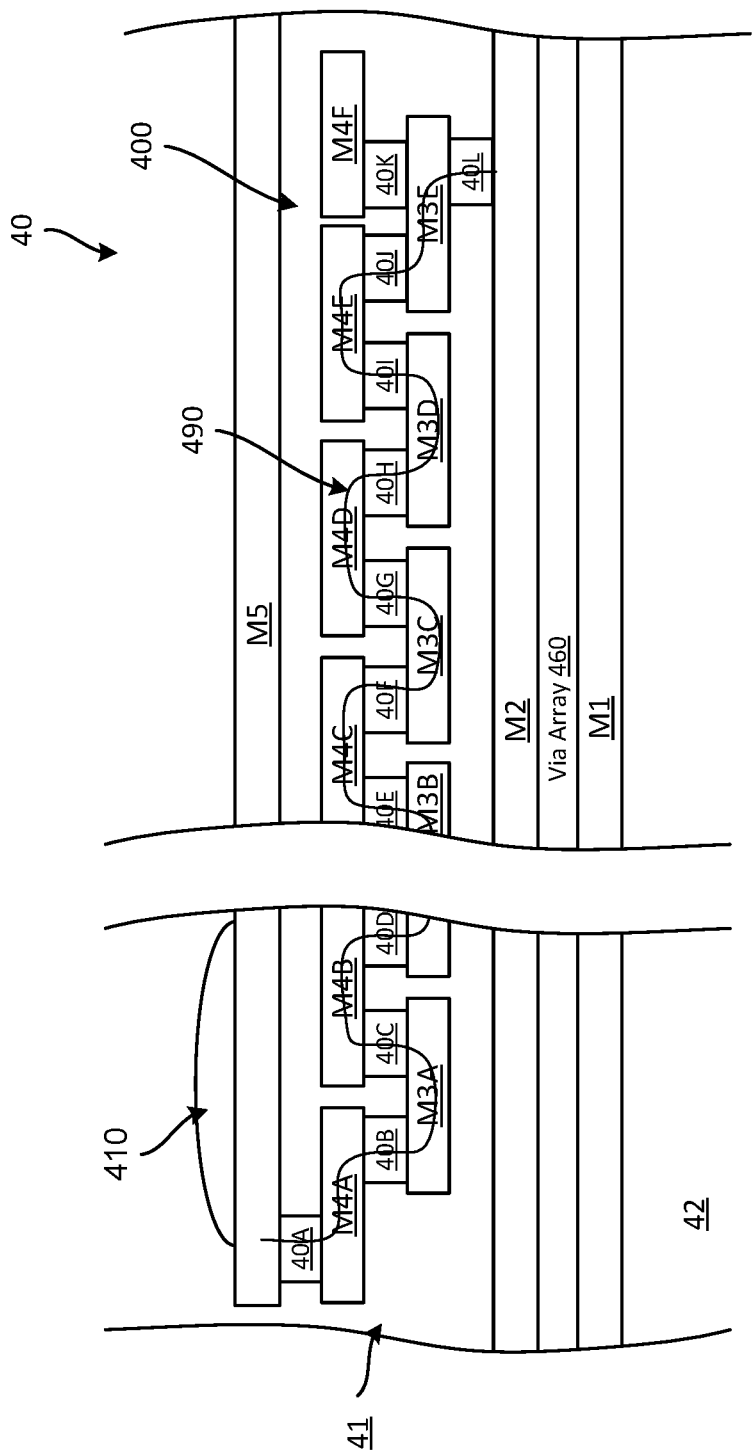
FIG. 4 is a diagram that illustrates an example resistive element that is a variation of the resistive element shown in FIGS. 1A through 1C.

FIG. 4 is a diagram that illustrates an example resistive element 400 that is a variation of the resistive element 100 shown in FIGS. 1A through 1C. FIG. 4 illustrates a side cross-sectional view of the resistive element 400. Because the resistive element 400 is a variation of the resistive element 100, not all of the features (which can be included) associated with the resistive element 100 will be described again in connection with the resistive element 400. The resistive element 300 can also include any of the features included any of the resistive elements described herein.

As shown in FIG. 4, the resistive element 400 is included in a portion of a semiconductor device 40 that includes five (5) metal layers (M1 through M5). The metal layers are included in metal layer portion 41, and the metal layer portion 41 is disposed on the semiconductor substrate 42.

The resistive element 400 includes primarily two metal layers (metal layer M3 and metal layer M4) and is disposed between metal layer M2 and metal layer M5. The metal layer M3 includes at least metal segments M3A through M3E, and the metal layer M4 includes at least metal layers M4A through M4F. At least via arrays 40B through 40K are coupled (e.g., disposed) between the metal layers M3 and M4. Via arrays 460 are coupled between metal layers M1 and M2. In this implementation, the via array 40A electrically couples the bulk of the resistive element 400 to metal layer M5 and a contact pad 410 (e.g., an output pad). The via array 40L electrically couples the bulk of the resistive element 400 to metal layer M2 (and potentially to semiconductor devices included in the semiconductor substrate 42).

In some implementations, the portion of the semiconductor device 40, or variations thereof, can be included in a variety of devices. For example, the portion of the semiconductor device 40 shown in FIG. 4 can be coupled between a low-side driver of a half-bridge device (not shown) and a high-side driver of a half-bridge device (not shown). In some implementations, as an example, the metal segment M4F (or another metal segment) can be a sense point or node to a converter (not shown).

In some implementations, the metal layers M1 through M3 can have a metal vertical thickness of, for example, approximately between 3 to 7 kA (e.g., 5.3 kA) and a vertical spacing between metal layers of approximately 6 to 9 kA (e.g., 8.5 kA). In some implementations, the metal layer M4 can have a metal vertical thickness of, for example, approximately between 8 to 12 kA (e.g., 9.9 kA) and a vertical spacing from a lower metal layer of approximately 8 to 12 kA (e.g., 10.0 kA). In some implementations, the metal layer M4 can have a lateral spacing between metal layers of approximately 3 to 7 kA (e.g., 4.4 kA). In some implementations, the metal layer M5 can have a metal vertical thickness of, for example, approximately 25 to 55 kA (e.g., 40 kA).

In this implementation, the resistive element 400 can be targeted to have a resistance of approximately 150 mil. In some implementations, the resistance can be larger than 150 m$\Omega$ or less than 150 m$\Omega$. As shown in FIG. 4, the resistive element 400 can have a resistive path 490.

Figure 5B:
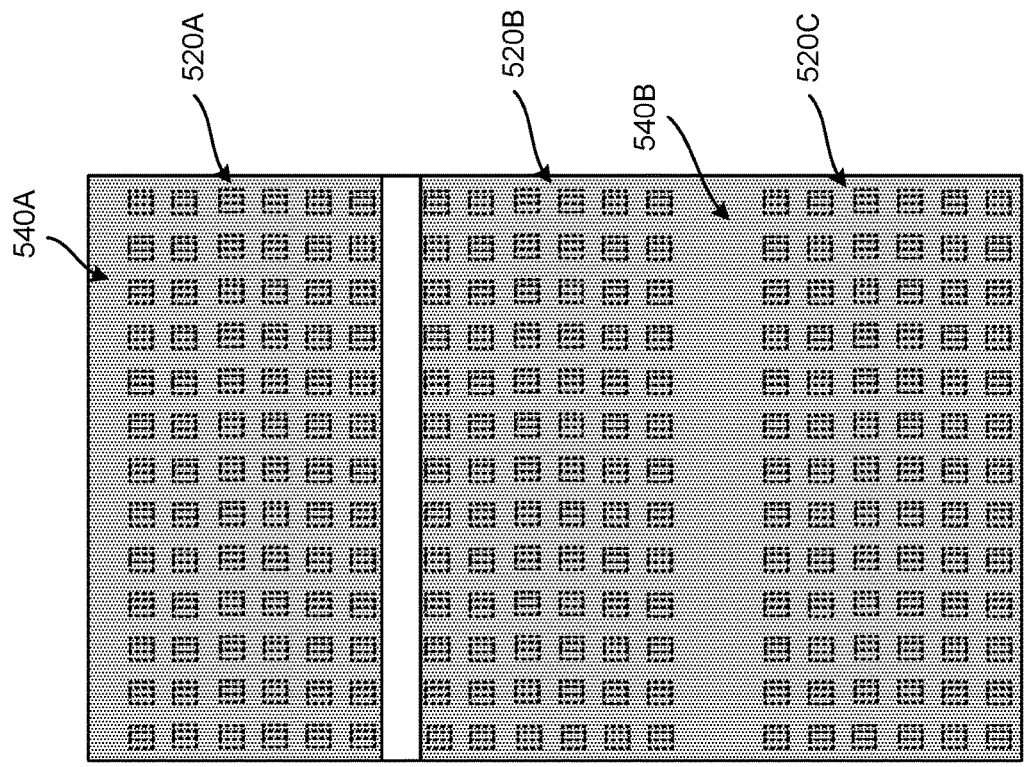
FIGS. 5A and 5B are diagrams that illustrate example top views of portions of two different metal layers and via arrays included in a resistive element.
Figure 5A:
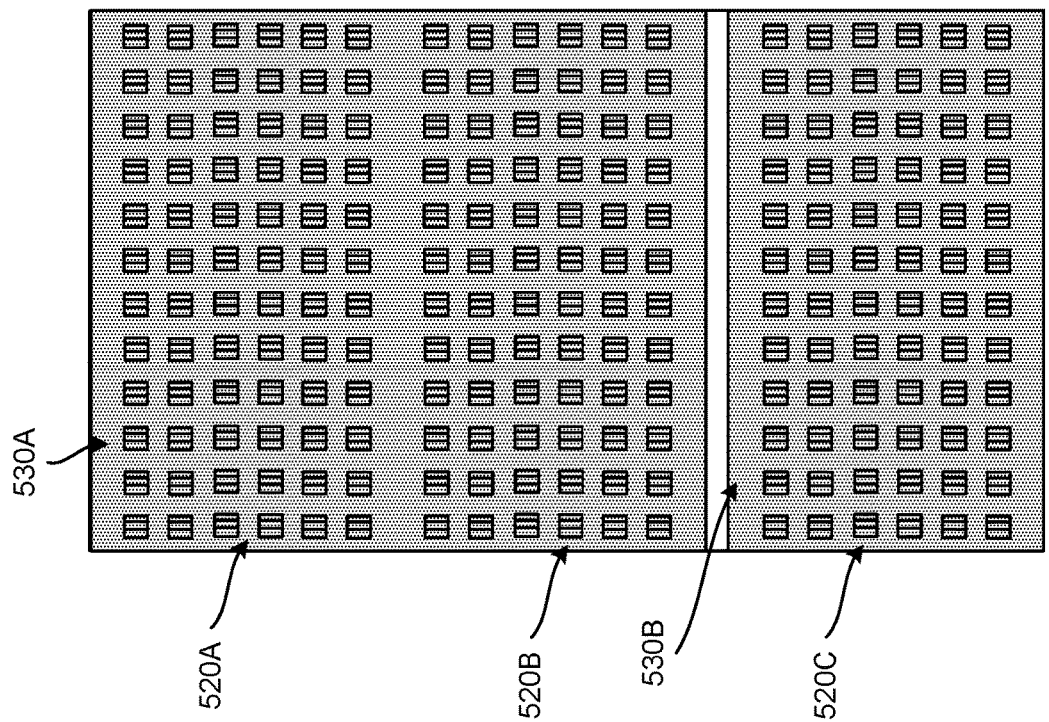

FIGS. 5A and 5B are diagrams that illustrate example top views of portions of two different metal layers and via arrays included in a resistive element. FIG. 5A illustrates a top view of a lower metal layer (e.g., metal layer M3) including metal segments 530A and 530B, and FIG. 5B illustrates a top view of an upper metal layer (e.g., metal layer M4) including metal segments 540A and 540B. The via arrays 520A through 520C shown in FIG. 5A correspond with the via arrays 520A through 520C shown in FIG. 5B.

As shown in FIGS. 5A and 5B, the spacing between the metal segments 520A, 520B of the lower metal layer is less than the spacing between the metal segments 540A, 540B of the upper metal layer. The spacing is different when the thickness (e.g., vertical thickness) of the lower metal layer, in this implementation is less than the thickness of the upper metal layer. These spacing differences can prevent shorting between segments of the metal layers during manufacturing.

Figure 6:
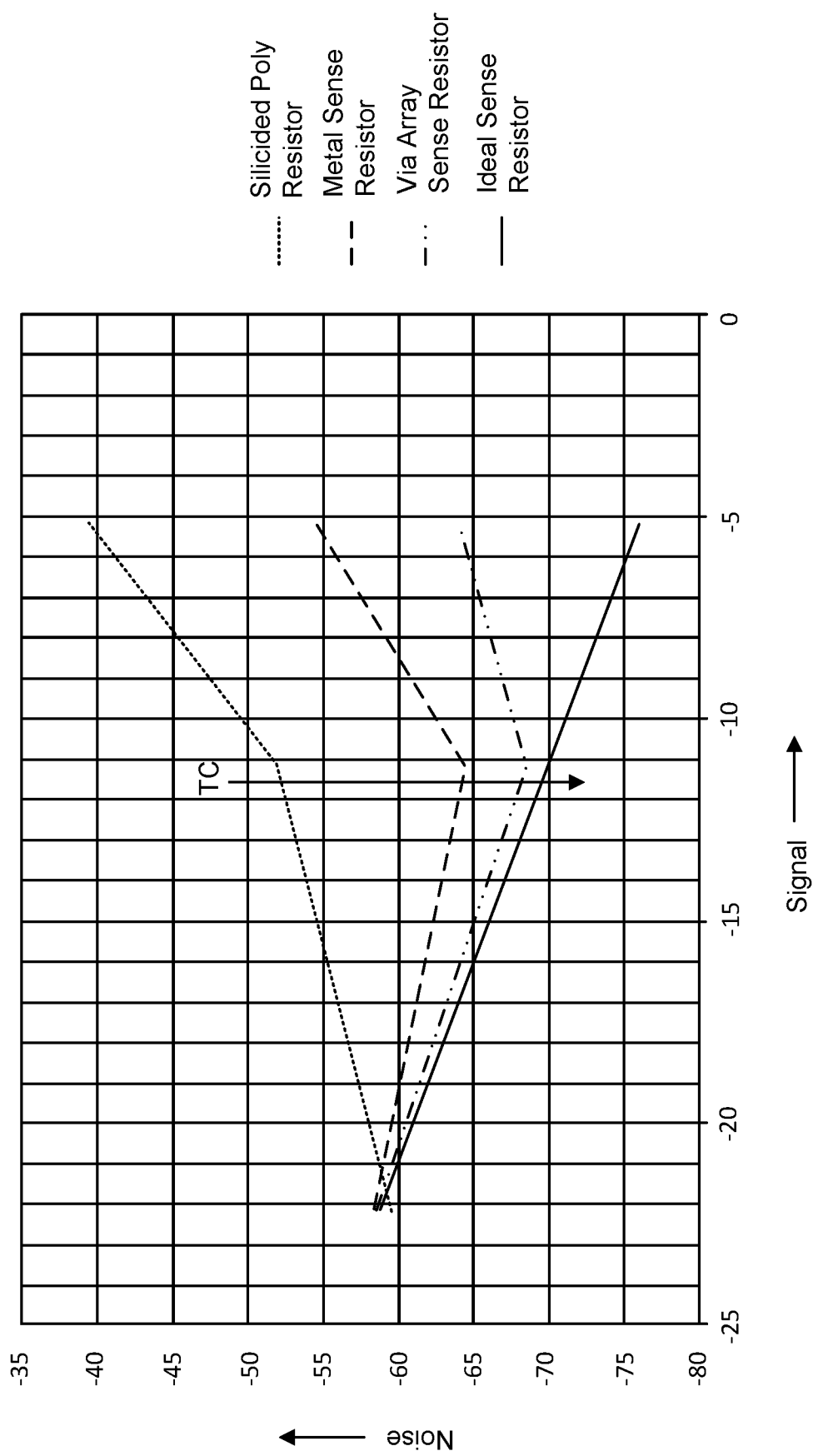
FIG. 6 is a diagram that illustrates performance of sense resistors of different types.

FIG. 6 is a diagram that illustrates performance of sense resistors of different types. FIG. 6 illustrate noise (dB) (e.g., distortion, total harmonic distortion (THD) and/or noise) along the Y-axis and a signal (dB) (e.g., a full scale output signal) along an X-axis. This graph illustrates first and second order voltage coefficients based on self-heating effects (e.g., temperature coefficient effects) and on alternating current (AC) and direct current (DC) bench results taken over load current.

The response of the ideal sense resistor is shown in FIG. 6 and the response of the resistive elements (shown as via array sense resistor) described herein is shown as following the ideal sense resistor more closely than a metal sense resistor or a silicided polysilicon resistor. The reduction in the overall temperature coefficient of the via array sense resistor can result in an improved performance of, for example, approximately 9 dB in signal to noise ratio (SNR).

Figure 7A:
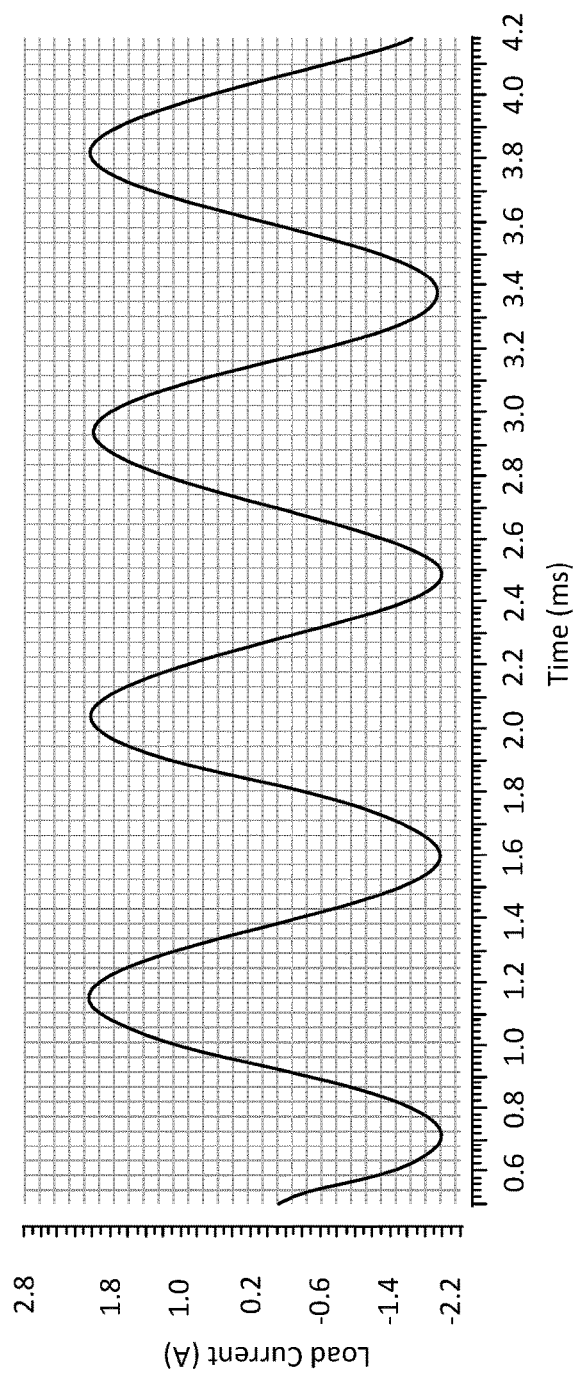
FIG. 7A is a graph that illustrates a sensed current in a load versus time.
Figure 7B:
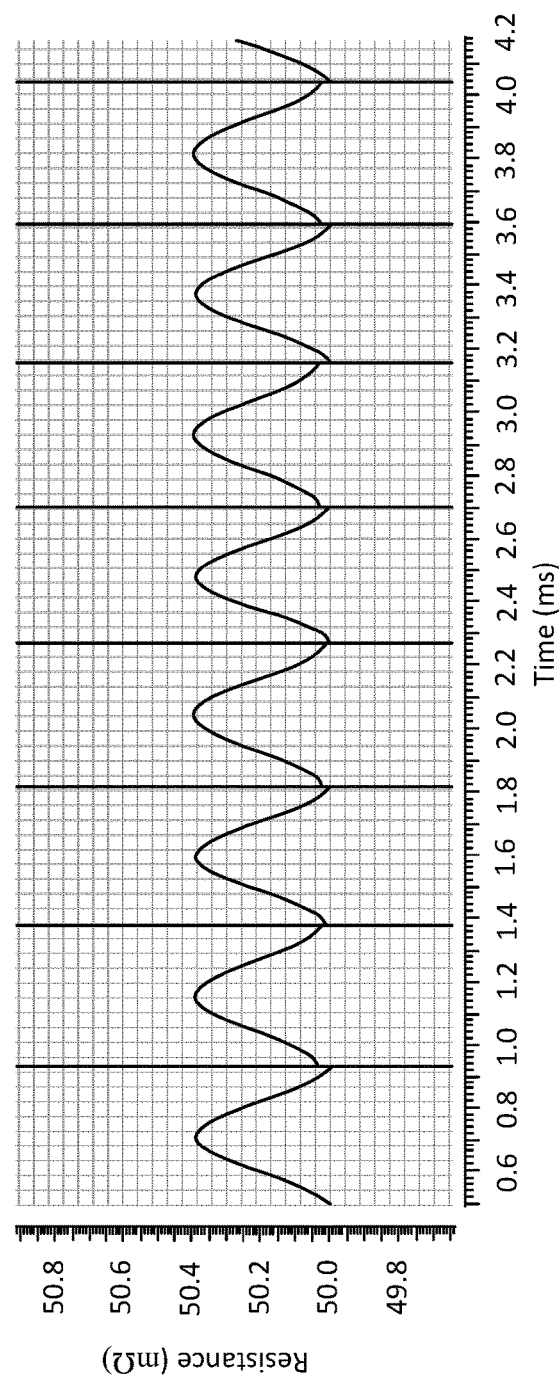
FIG. 7B illustrates a resistance/temperature of a resistive element versus time over the same time range as shown in FIG. 7A.

FIG. 7A is a graph that illustrates a load current (A) versus time (ms). FIG. 7B illustrates a resistance (m$\Omega$) of a resistive element versus time (ms) over the same time range as shown in FIG. 7A. As shown in FIGS. 7A and 7B, the resistance increases at the peaks and troughs of the sensed current in an unexpected fashion. Due to the temperature coefficient of the sense resistor, the resistance also fluctuates.

Figure 8:
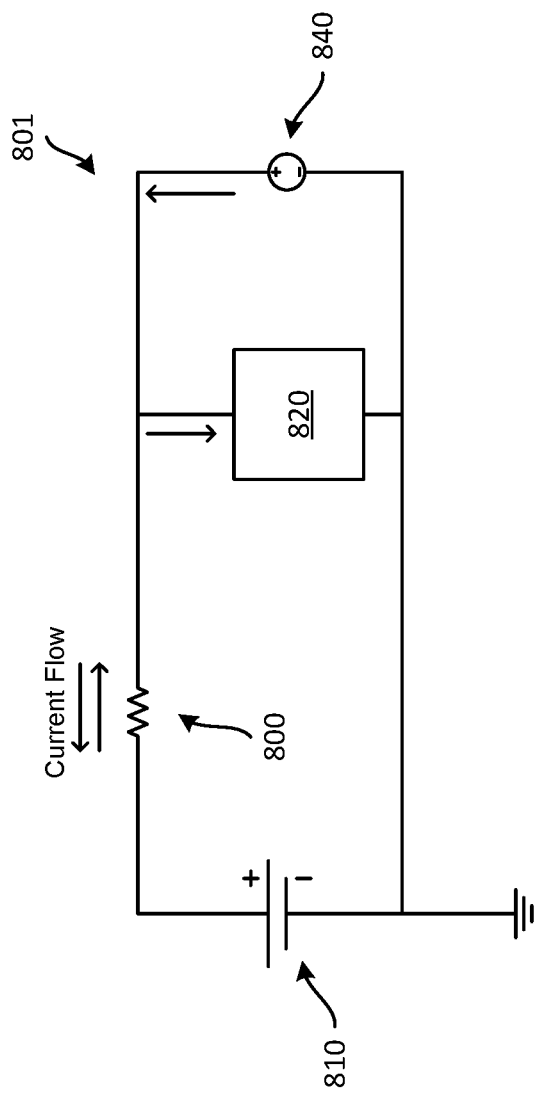
FIG. 8 is a circuit including a resistive element.

FIG. 8 is a circuit 801 including a resistive element 800. The circuit 801 includes a battery 810 (e.g., a DC battery source), a system load 820, and a power supply 840. In this implementation, the circuit 810 can be configured to sense charge/discharge battery current for fuel gauging.

Figure 9:
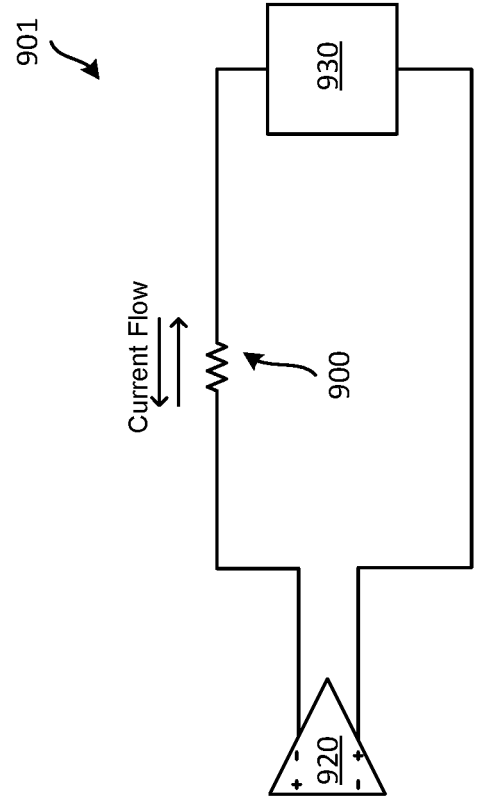
FIG. 9 is a circuit configured to sense a current, via a resistive element, to a linear resonant actuator (LRA) load.

FIG. 9 is a circuit 901 configured to sense a current, via a resistive element 900, to a linear resonant actuator (LRA) load. The sensed current can be used to calculate a temperature. In this implementation, the circuit 801 includes an amplifier AC source 920 and an LRA load 930.

In some implementations, the resistive elements described herein can be used in a speaker sense application in which low THD is desirable. Achieving a current sense THD using the resistive elements described herein can result in relatively low die cost and/or smaller board area. In some implementations, the resistive elements can eliminate the need for an external sense resistor.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   a first terminal;
   a second terminal; and
   a resistive element extending between the first terminal and the second terminal, the resistive element including:
      a first array of vias in contact with a first segment of a first metal layer and a first segment of a second metal layer;
      a second array of vias in contact with the first segment of the second metal layer and a second segment of the first metal layer; and
      a third array of vias in contact with the second segment of the first metal layer and a second segment of the second metal layer,
      vias of the first array of vias, the second array of vias and the third array of via including a first conductive material,
      the first metal layer including a second conductive material,
      the second metal layer including a third conductive material,
      the first conductive material having a temperature coefficient of resistance that is less than a temperature coefficient of resistance of the second conductive material,
      the temperature coefficient of resistance of the first conductive material being less than a temperature coefficient of resistance of the second conductive material, and
      more than half of the resistive element being made of the first conductive material.

2. The apparatus of claim 1, wherein the first segment of the first metal layer and the second segment of the first metal layer are aligned within a same plane, the first segment of the first metal layer being electrically isolated from the second segment of the first metal layer within the plane by a dielectric.

3. The apparatus of claim 1, wherein the first metal layer is disposed within a plane parallel to the second metal layer.

4. The apparatus of claim 1, wherein the first array of vias, the second array of vias, and the third array of vias intersect a plane.

5. The apparatus of claim 1, wherein the resistive element defines a resistive path having a serpentine shape in a cross-sectional view.

6. The apparatus of claim 1, wherein the resistive element is included in a current sense resistor within a load driver.

7. The apparatus of claim 1, wherein more than 80% of the resistive element is made of tungsten.

8. The apparatus of claim 1, wherein the vias of the first array of vias include a tungsten material or an aluminum material.

9. The apparatus of claim 1, wherein the first array of vias is an array of vias including more than 4 vias.

10. An apparatus, comprising:
    a first terminal;
    a second terminal; and
    a resistive element extending between the first terminal and the second terminal, the resistive element defining a resistive path alternating between segments of a first metal layer and a segments of a second metal layer through a plurality of via arrays disposed between the segments of the first metal layer and segments of the second metal layer,
    vias of the plurality of via arrays including a first conductive material,
    the first metal layer and the second metal layer including a second conductive material,
    the first conductive material having a temperature coefficient of resistance that is less than a temperature coefficient of resistance of the second conductive material, and
    more than half of the resistive element being made of the first conductive material.

11. The apparatus of claim 10, wherein the resistive path alternating between segments of the first metal layer and the segments of the second metal layer through the plurality of via arrays has a serpentine structure in a cross-sectional view.

12. The apparatus of claim 11, wherein the serpentine structure is defined, at least in part, by a dielectric disposed between each pair of segments of the first metal layer and between each pair of segments of the second metal layer.

13. The apparatus of claim 10, wherein the resistive path includes, in order:
    a first segment from the segments of the first metal layer,
    a first via array from the plurality of via arrays,
    a first segment from the segments of the second metal layer,
    a second via array from the plurality of via arrays,
    a second segment from the segments of the first metal layer,
    a third via array from the plurality of via arrays, and
    a second segment from the segments of the second metal layer.

14. The apparatus of claim 10 wherein the segments of the first metal layer are disposed within a plane parallel to the segments of the second metal layer.

15. The apparatus of claim 10, wherein more than 90% of the resistive element is made of tungsten.

16. An apparatus, comprising:
    a first terminal;
    a second terminal; and
    a resistive element extending between the first terminal and the second terminal, the resistive element including:
       a plurality of segments of a first metal layer;
       a plurality of segments of a second metal layer; and
       a plurality of vias including arrays of vias coupled between segments of the plurality of segments of the first metal layer alternating with segments of the plurality of segments of the second metal layer,
    the plurality of vias of the arrays of vias including a first conductive material,
    the first metal layer and the second metal layer including a second conductive material,
    the first conductive material having a temperature coefficient of resistance that is less than a temperature coefficient of resistance of the second conductive material, and
    more than half of the resistive element being made of the first conductive material.

17. The apparatus of claim 16, wherein the plurality of vias including arrays of vias coupled between alternating segments of the plurality of segments of the first metal layer and segments of the plurality of segments of the second metal layer define a serpentine structure in a cross-sectional view.

18. The apparatus of claim 16, wherein plurality of vias is disposed between the first metal layer and the second metal layer, the resistive element further including a second plurality of vias and a third metal layer.

19. The apparatus of claim 16, wherein the first terminal is electrically coupled to an integrated circuit.

20. The apparatus of claim 1, wherein the second conductive material and the third conductive material are a same conductive material.

21. The apparatus of claim 2, further comprising:
a fourth array of vias in contact with the first segment of the first metal layer and a segment of a third metal layer,
vias of the fourth array of vias including the first conductive material,
the third metal layer including the second conductive material or the third conductive material, and
the fourth array of vias being aligned with the first array of vias along a line that is orthogonal to the plane.

* * * * *